United States Patent
Jang et al.

(10) Patent No.: US 7,662,681 B2
(45) Date of Patent: Feb. 16, 2010

(54) METHOD FOR FABRICATING REVERSE-STAGGERED THIN FILM TRANSISTOR

(75) Inventors: Jin Jang, Seoul (KR); Jun-Hyuk Cheon, Seoul (KR)

(73) Assignee: Kyunghee University Industrial & Academic Collaboration Foundation, Seoul (KR)

( * ) Notice: Subject to any disclaimer, the term of this patent is extended or adjusted under 35 U.S.C. 154(b) by 370 days.

(21) Appl. No.: 11/609,374

(22) Filed: Dec. 12, 2006

(65) Prior Publication Data

US 2007/0134856 A1 Jun. 14, 2007

(30) Foreign Application Priority Data

Dec. 14, 2005 (KR) ............... 10-2005-0123166

(51) Int. Cl.
 *H01L 21/00* (2006.01)
 *H01L 21/84* (2006.01)
(52) U.S. Cl. .................. 438/166; 257/E21.133
(58) Field of Classification Search .......... 438/158, 438/166; 257/E21.133, E21.414
See application file for complete search history.

(56) References Cited

U.S. PATENT DOCUMENTS

2004/0241920 A1 12/2004 Hsiao et al.
2005/0170643 A1* 8/2005 Fujii et al. ............... 438/637

* cited by examiner

*Primary Examiner*—W. David Coleman
(74) *Attorney, Agent, or Firm*—Locke Lord Bissell & Liddell LLP

(57) ABSTRACT

Disclosed herein is a method for fabricating a reverse-staggered polycrystalline silicon thin film transistor, and more specifically a method for fabricating a reverse-staggered polycrystalline silicon thin film transistor wherein a phospho-silicate-spin-on-glass (P-SOG) is used for a gate insulating film. The method comprises the steps of: forming a buffer layer on an insulating substrate; forming a gate metal pattern on the buffer layer; forming a planarized gate insulating film on the gate metal pattern; depositing an amorphous silicon layer on the gate insulating film; crystallizing the amorphous silicon layer into a polycrystalline silicon layer; forming a n+ or p+ layer on the polycrystalline silicon layer; forming a source/drain metal layer on the n+ or p+ layer; and forming a passivation layer on the source/drain metal layer.

18 Claims, 4 Drawing Sheets

METHOD FOR FABRICATING REVERSE-STAGGERED THIN FILM TRANSISTOR

BACKGROUND OF THE INVENTION

1. Field of the Invention

The present invention relates to a method for fabricating a reverse-staggered polycrystalline silicon thin film transistor, and more specifically to a method for fabricating a reverse-staggered polycrystalline silicon thin film transistor wherein a phosphosilicate-spin-on-glass (P-SOG) is used for a gate insulating film.

2. Description of the Related Art

Devices using a polycrystalline silicon thin film are mainly utilized in a variety of appliances including active devices of active matrix liquid crystal displays (AMLCDs), and switching devices and peripheral circuits of electroluminescent (EL) devices.

Since the devices using the polycrystalline silicon thin film are suitable for realization in a high response rate and a large pixel number, they can greatly contribute to obtaining a superior picture quality, large-size screen and excellent color representation of display devices.

Laser beam radiation and solid phase crystallization using a high-temperature heat treatment have been generally used to convert an amorphous silicon film into a polycrystalline silicon film.

In the laser beam radiation, a crystallization process can be performed at a low temperature (i.e., 400° C. or below). Also, a polycrystalline silicon film having a high field-effect mobility can be achieved. However, the laser beam radiation makes it difficult to ensure a uniform crystallization of a sample when the sample has a large area, and requires expensive laser equipment. Thus, there remains a demand for alternative technologies to solve these problems.

Meanwhile, in accordance with the solid phase crystallization using a high-temperature heat treatment, a polycrystalline silicon thin film is fabricated by heating at a high temperature (i.e., 600° C. or above) for a long time. However, the solid phase crystallization requires a high crystallization temperature and a long heating time. Furthermore, polycrystalline silicon grains formed by the solid phase crystallization may have many defects, thereby making it difficult to fabricate devices using the polycrystalline silicon thin film. In addition, due to the high crystallization temperature, it is impossible to use a glass substrate.

Recently, crystallization using a metal medium, (e.g., metal induced crystallization (MIC) and metal induced lateral crystallization (MILC)) has been suggested [G. Liu and S. J. Fonash, Appl. Phys. Lett. 62, 2554 (1993)].

According to the crystallization using a metal medium, a thin film is uniformly formed to produce a polycrystalline silicon thin film transistor having a high field-effect mobility. However, the polycrystalline silicon thin film fabricated by this crystallization may have defects in device structure resulting from a metal contamination, thereby having a limitation on electric properties.

In attempts to solve these problems, various methods have been proposed. For example, metal induced lateral crystallization of amorphous silicon through a silicon nitride cap layer has been suggested [(J. H. Choi, D. Y. Kim, B. K. Choo, W. S. Sohn, and J. Jang. Electrochem. Solid-State Lett, 6, G16 (2003)]. In accordance with this method, a cap layer interposed between an amorphous silicon layer and a metal layer, to control a diffusion of the metal, thereby reducing a metal contamination. Meanwhile, metal-induced crystallization has been employed to obtain a superior polycrystalline silicon thin film while minimizing a metal amount [J. H. Ahn and B. T. Ahn, Journal of The Electrochemical Society, 148, H115 (2001)]. According to this crystallization, a metal ion is deposited in a concentration of $10^{12}$ to $10^{14}$ cm$^{-2}$ using an ion injector. The deposited film is subjected to high temperature heating, rapid thermal annealing (RTA) or laser beam radiation, to form a polycrystalline silicon thin film. Then, a mixture of a viscous organic material and a liquid metal is deposited on the thin film by spin coating. The resulting film is subjected to metal-induced crystallization with heating, to obtain a polycrystalline silicon thin film having a leveled surface. However, there has been no technology capable of completely solving a metal contamination, which is a primary problem of the polycrystalline silicon thin film.

SUMMARY OF THE INVENTION

In an attempt to solve the above-mentioned problems of the prior arts, it is an object of the present invention to provide a method for fabricating a reverse-staggered polycrystalline silicon thin film transistor that reduces a metal contamination and realizes gate planarization by a gate insulating film of phosphosilicate-spin-on-glass (P-SOG) absorbing metal residues left on a polycrystalline silicon thin film formed on accordance with crystallization of an amorphous silicon thin film, and achieves a uniform grain size of the polycrystalline silicon thin film by a cap layer formed on the amorphous silicon thin film, thereby ensuring a clean and flat surface.

In accordance with an aspect of the present invention for achieving the above object, there is provided a method for fabricating a reverse-staggered polycrystalline silicon thin film transistor comprising the steps of: forming a buffer layer on an insulating substrate; forming a gate metal pattern on the buffer layer; forming a planarized gate insulating film on the gate metal pattern; depositing an amorphous silicon layer on the gate insulating film; crystallizing the amorphous silicon layer into a polycrystalline silicon layer; forming a n+ or p+ layer on the polycrystalline silicon layer; forming a source/drain metal layer on the n+ or p+ layer; and forming a passivation layer on the source/drain metal layer.

The step of crystallizing the amorphous silicon layer into a polycrystalline silicon layer may include the sub-steps: forming a cap layer on the amorphous silicon layer; depositing a metal film on the cap layer; and subjecting the amorphous silicon layer to metal-induced crystallization.

The buffer layer may be formed of a phosphosilicate-spin-on-glass (P-SOG) film. The P-SOG film may have a thickness of 100 nm to 3000 nm. The P-SOG film may comprise phosphorus (P) of 5 ppm to 10000 ppm. The P-SOG film may be formed by coating methods such as spin costing.

The gate metal pattern may be made of molybdenum (Mo), molytungsten (MoW) or tungsten (W).

The gate insulating film may be a phosphosilicate-spin-on-glass (P-SOG) film or a silicon oxide film. The P-SOG film may have a thickness of 100 nm to 3000 nm. The P-SOG film may comprise phosphorus (P) of 5 ppm to 10000 ppm. The P-SOG film may be formed by coating methods such as spin coating.

The amorphous silicon layer preferably may have a thickness of 20 nm to 1000 nm.

The step of crystallizing the amorphous silicon layer into a polycrystalline silicon layer may be carried out by heating. The heating preferably may be conducted at a temperature of 400° C. to 700° C.

The step of crystallizing the amorphous silicon layer into a polycrystalline silicon layer may further include the step of pre-heating to form metal disilicide in the amorphous silicon layer, before subjecting the amorphous silicon layer to metal-induced crystallization. The pre-heating may be conducted at a temperature of 200° C. to 700° C.

The cap layer may be a silicon nitride film or a silicon nitride oxide film. The deposition of the cap layer may be achieved by plasma enhanced chemical vapor deposition (PECVD) at a temperature of 300° C. to 550° C.

In addition, the cap layer may be a double layer in which there is a difference in thickness between two layers. Preferably, the cap layer may have a thickness of 5 nm to 1000 nm.

The polycrystalline silicon may have disc-shaped grains.

The metal film on the cap layer may have an area density of $10^{12}/cm^2$ to $10^{15}/cm^2$. The metal film may be made of nickel (Ni), cobalt (Co), palladium (Pd), platinum (Pt), iron (Fe), copper (Cu), silver (Ag), gold (Au), indium (In), tin (Sn), arsenic (As), antimony (Sb) or an alloy thereof. The metal film on the cap layer may be formed by deposition using ion implantation, plasma chemical vapor deposition (PCVD) or sputtering, coating using a liquid metal dissolved in an acid solution, or spin coating using a mixture of a viscous organic material and a liquid metal.

The n+ or p+ layer may be made of amorphous silicon or microcrystalline silicon.

The source/drain metal layer may be made of molybdenum (Mo), molytungsten (MoW), chromium (Cr), aluminium (Al) or an alloy thereof.

The gate insulating film on the gate metal pattern may have a planarized surface.

A poly-Si after crystallization has grains with polygon structure.

The grain size is between 10 and 100 μm.

The poly-Si has the grain boundaries of straight lines.

The poly-Si has the average Ni concentration between $10^{12}$~$10^{15}$ cm$^{-2}$.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, reference will now be made in detail to the preferred embodiments of the present invention associated with a method fabricating a reverse-staggered polycrystalline silicon thin film transistor according to the present invention, examples of which are illustrated in the annexed drawings.

Figure 1:
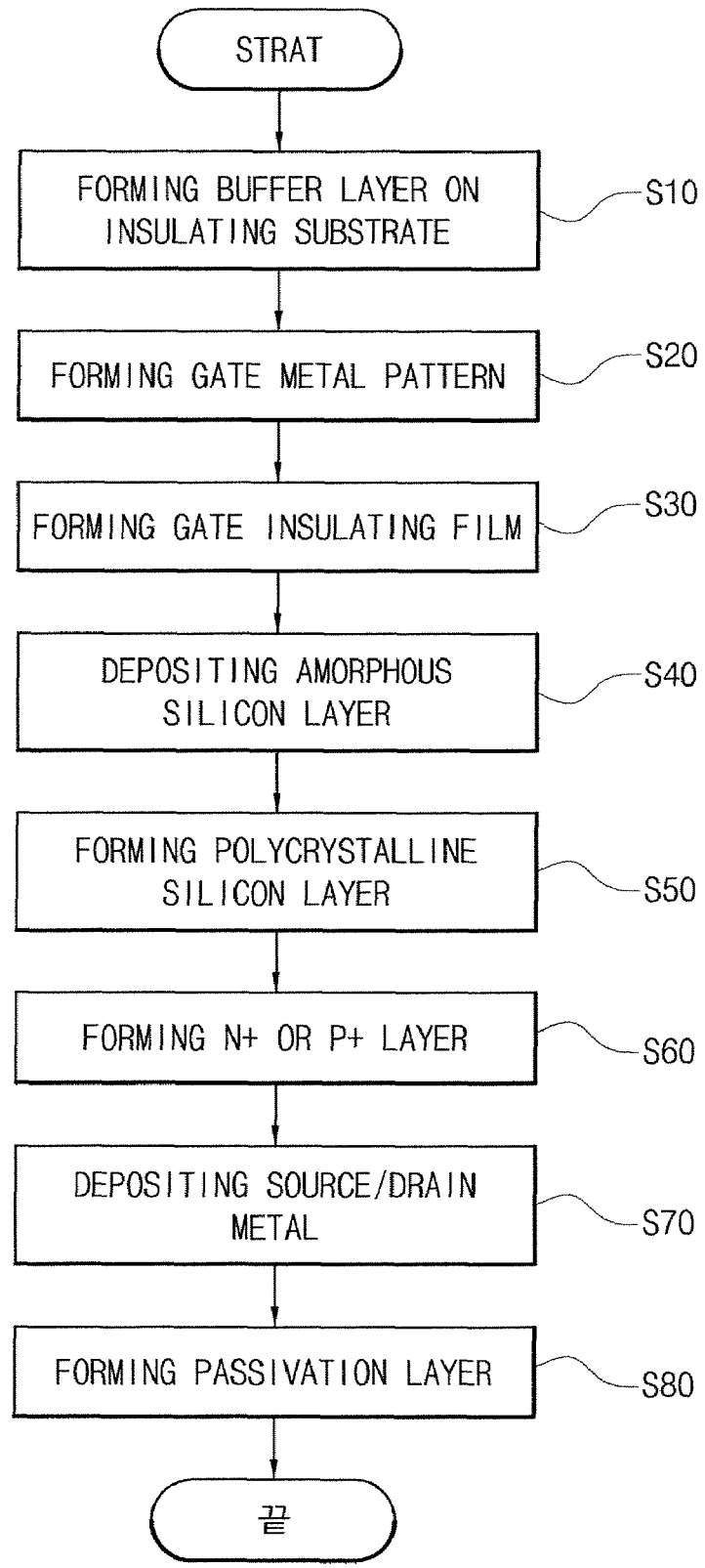
FIG. 1 is a flow chart illustrating a procedure for fabricating a reverse-staggered polycrystalline silicon thin film transistor according to the present invention.

FIG. 1 is a flow chart illustrating a method for fabricating a reverse-staggered polycrystalline silicon thin film transistor according to an embodiment of the present invention.

As shown in FIG. 1, the method fabricating a reverse-staggered polycrystalline silicon thin film transistor comprises the steps of: forming a buffer layer on an insulating substrate (S10); forming a gate metal pattern on the buffer layer (S20); forming a planarized gate insulating film on the gate metal pattern (S30); depositing an amorphous silicon layer on the gate insulating film (S40); crystallizing the amorphous silicon layer into a polycrystalline silicon layer (S50); forming an n+ or p+ layer on the polycrystalline silicon layer (S60); depositing a source/drain metal layer on the n+ or p+ layer (S70); and forming a passivation layer on the source/drain metal layer (S80).

The step of crystallizing the amorphous silicon layer into a polycrystalline silicon layer (S50) includes the sub-steps: forming a cap layer on the amorphous silicon layer; depositing a metal film on the cap layer; and subjecting the amorphous silicon layer to metal-induced crystallization.

The buffer layer is preferably made of a phosphosilicate-spin-on-glass (P-SOG). The P-SOG film is preferably formed by a coating method such as spin coating.

Figure 2:
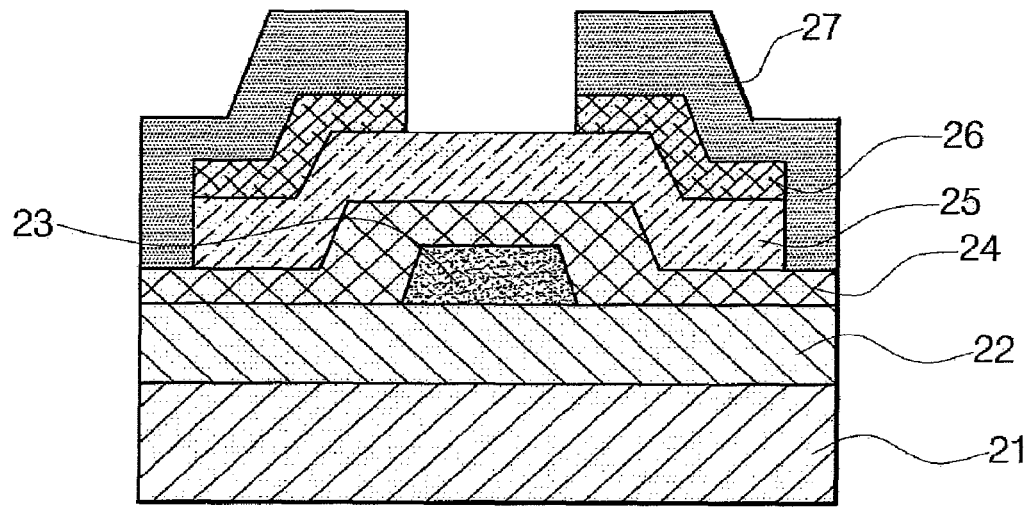
FIG. 2 shows a structure of a reverse-staggered polycrystalline silicon thin film transistor wherein a phosphosilicate-spin-on-glass (P-SOG) film is used for a buffer layer.

FIG. 2 shows a structure of a reverse-staggered polycrystalline silicon thin film transistor wherein a phosphosilicate-spin-on-glass (P-SOG) is used for a buffer layer.

The structure of the reverse-staggered polycrystalline silicon thin film transistor and a process for fabricating the same will be described with reference to FIG. 2.

First, a buffer layer 22 as a P-SOG film is formed on a flexible metal or a glass substrate 21. The formation of the P-SOG film is carried out by spin coating or printing.

Next, sputtering and etching processes are performed to form a gate metal film 23 having a thickness of about 100 nm. A gate insulating film 24 as a silicon oxide film is deposited to a thickness of 150 nm on the gate metal film 23 by chemical vapor deposition (CVD). An amorphous silicon thin film is deposited to a thickness of 50 nm on the gate insulating film 24. A cap layer is deposited to a thickness of 50 nm on the amorphous silicon thin film. Then, a metal thin film is deposited on the cap layer using a sputter.

The resulting structure is heated in a furnace to form a polycrystalline silicon layer 25. At this time, the deposition of the metal thin film is achieved by ion implantation or plasma chemical vapor deposition (PCVD). The PCVD is carried out by disposing a metal on the silicon thin film and exposing the metal to plasma.

The metal thin film is formed by spin coating using a liquid metal dissolved in an acid solution, or a mixture of a viscous organic and a liquid metal. An n+ or p+ layer 26 is formed on the polycrystalline silicon layer 25. A source/drain metal 27 is deposited on the N+ or p+ layer 26 by sputtering.

The P-SOG film preferably has a thickness of 100 nm to 3000 nm. The P-SOG film preferably comprises phosphorus (P) of 5 ppm to 10000 ppm.

A gate metal pattern is formed on the buffer layer 22. The gate metal pattern is preferably made of molybdenum (Mo), molytungsten (MoW) or tungsten (W).

A gate insulating film is formed on the gate metal pattern. The gate insulating film is preferably a silicon oxide film or a P-SOG film.

Figure 3:
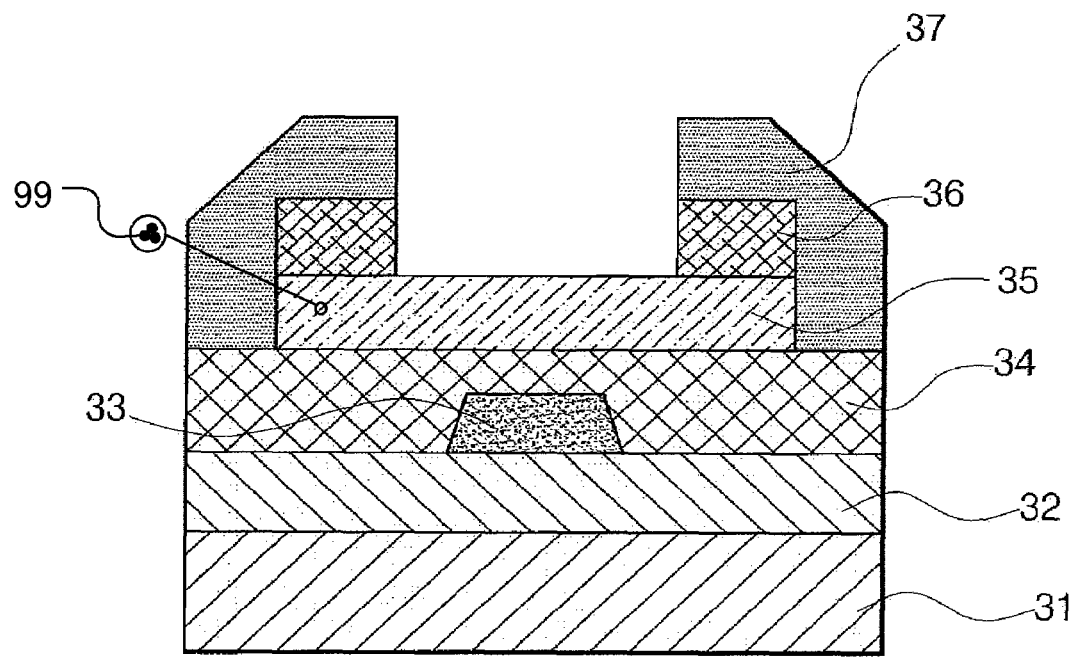
FIG. 3 shows a structure of a reverse-staggered polycrystalline silicon thin film transistor wherein a phosphosilicate-spin-on-glass (P-SOG) film is used for a gate insulating layer.

A structure of a reverse-staggered polycrystalline silicon thin film transistor wherein a phosphosilicate-spin-on-glass (P-SOG) film is used for a gate insulating film, and a method fabricating the same will be described with reference to FIG. 3.

First, a buffer layer 32 as a P-SOG film is formed on a flexible metal substrate or a glass substrate 31. The P-SOG film is carried out by spin coating or printing.

Next, sputtering and etching processes are performed to form a gate metal film 33 having a thickness of about 100 nm. A gate insulating film 34 as a silicon oxide film is deposited to a thickness of 150 nm on the gate metal film 33 by spin coating. An amorphous silicon thin film is deposited to a thickness of 50 nm on the gate insulating film 34. A cap layer is deposited to a thickness of 50 nm on the amorphous silicon thin film. Then, a metal thin film is deposited on the cap layer using a sputter.

The resulting structure is heated in a furnace to form a polycrystalline silicon layer 35. At this time, the P-SOG film used for the gate insulating film 34 absorbs metal residues left on the amorphous silicon thin film after planarization and crystallization of the gate metal film 33, thereby reducing a metal contamination in the polycrystalline silicon layer 35.

The deposition of the metal thin film is achieved by ion implantation or plasma chemical vapor deposition (PCVD). The PCVD is carried out by disposing a metal material on the silicon thin film and exposing the metal material to plasma.

The metal thin film is formed by spin coating using a liquid metal dissolved in an acid solution, or a mixture of viscous organic material and the liquid metal. An n+ or p+ layer 36 is formed on the poly crystalline silicon layer 35. A source/drain metal 37 is deposited the n+ or p+ layer 36 by sputtering.

The P-SOG film as the buffer layer 32 preferably has a thickness of 100 nm to 3000 nm. The P-SOG film preferably comprises phosphorus (P) of 5 ppm to 10000 ppm. The amorphous silicon layer on the gate insulating film 34 preferably has a thickness of 20 nm to 1000 nm. The gate insulating film 34 has a planarized surface.

As described above, the amorphous silicon layer is crystallized to form the polycrystalline silicon layer 35. At this time, heating is used to form the polycrystalline silicon layer 35. The heating is preferably conducted at a temperature of 400° C. to 700° C.

Meanwhile, it is preferable to conduct a pre-heating process before crystallization into the polycrystalline silicon layer. The pre-heating induces formation of metal disilicide inside the amorphous silicon layer. The pre-heating is preferably conducted at a temperature range of 200° C. to 700° C.

The formation of the polycrystalline silicon layer is carried out by forming a cap layer on the amorphous silicon layer, depositing a metal film on the cap layer and subjecting the amorphous silicon layer to metal-induced crystallization. The cap layer is preferably a silicon nitride film or a silicon nitride oxide film. The deposition of the cap layer is achieved by plasma chemical vapor deposition (PCVD) at a temperature range of 300° C. to 550° C. Meanwhile, the cap layer is a multilayer including a double layer in which there is a difference in thickness among respective layers. Preferably, the cap layer has a thickness of 5 nm to 1000 nm.

A metal film is deposited on the cap layer. Then, the amorphous silicon layer is subjected to metal-induced crystallization by heating. After the crystallization, polycrystalline silicon has disc-shaped grains 99.

The metal film has preferably an area density of $10^{12}/cm^2$ to $10^{15}/cm^2$. The metal film is preferably made of nickel (Ni), cobalt (Co), palladium (Pd), platinum (Pt), iron (Fe), copper (Cu), silver (Ag), gold (Au), indium (In), tin (Sn), arsenic (As), antimony (Sb) or an alloy thereof.

The metal film is formed on the cap layer by deposition using ion implantation, plasma chemical vapor deposition (PCVD) or sputtering, coating using a liquid metal dissolved in an acid solution, or spin coating using a mixture of a viscous organic material and a liquid metal.

After formation of the polycrystalline silicon layer, an n+ or p+ layer is formed on the polycrystalline silicon layer. The n+ or p+ layer is made of microcrystalline silicon or amorphous silicon.

After formation of the n+ or p+ layer on the polycrystalline silicon layer, a source/drain metal layer is formed on the n+ or p+ layer. The source/drain metal layer is preferably made of molybdenum (Mo), molytungsten (MoW), chromium (Cr), aluminium (Al) or an alloy thereof.

A passivation layer is formed on the source/drain metal layer. The passivation layer may be also made of a P-SOG film.

Figure 4:
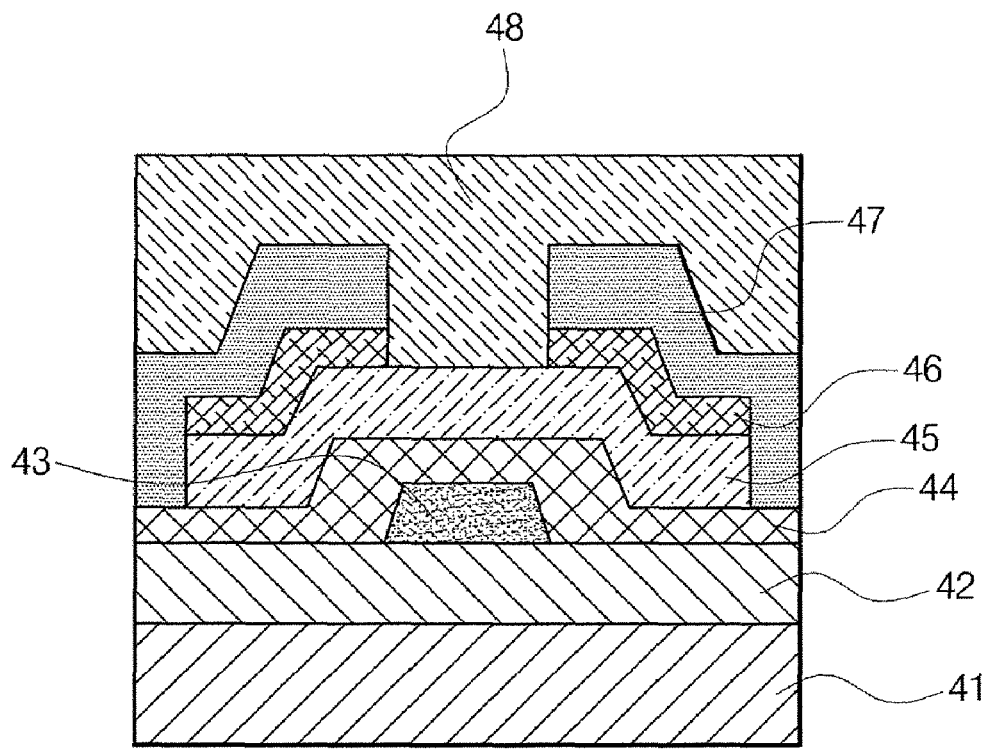
FIG. 4 shows a structure of a reverse-staggered polycrystalline silicon thin film transistor wherein a phosphosilicate-spin-on-glass (P-SOG) film is used for a passivation film.

FIG. 4 is a cross-sectional view illustrating a structure of a reverse-staggered polycrystalline silicon thin film transistor wherein a phosphosilicate-spin-on-glass (P-SOG) film is used for a passivation layer. The structure of the reverse-staggered polycrystalline silicon thin film transistor and a method fabricating the same will be described with reference to FIG. 4.

First, a buffer layer 42 as a P-SOG film is formed on a flexible metal substrate or a glass substrate 41. The formation of the buffer layer 42 is carried out by spin coating or printing.

Next, sputtering and etching process are performed to form a gate metal film 43 having a thickness of about 100 nm. A gate insulating film 44 as a silicon oxide film is deposited to a thickness of 150 nm on the gate metal film 43 by plasma chemical vapor deposition (PCVD). An amorphous silicon thin film is deposited to a thickness of 50 nm on the gate insulating film 44. A cap layer is deposited on the amorphous silicon thin film to a thickness of 50 nm. Then, a metal thin film is deposited on the cap layer by using a sputter.

The resulting structure is heated in a furnace to form a polycrystalline silicon layer 25. At this time, the deposition of the metal thin film is achieved by ion implantation or plasma chemical vapor deposition (PCVD). The PCVD is carried out by disposing a metal material on the silicon thin film and exposing the metal material to plasma.

The metal thin film may be formed of a liquid metal dissolved in an acid solution, or a mixture of a viscous organic material and a liquid metal using a spin coating method. An n+ or p+ layer 46 is formed on the polycrystalline silicon layer 45. A source/drain metal 47 is deposited on the n+ or p+ layer 46 by sputtering.

A passivation layer 48 is formed of a P-SOG film. The P-SOG is achieved by spin coating or printing.

Figure 5:
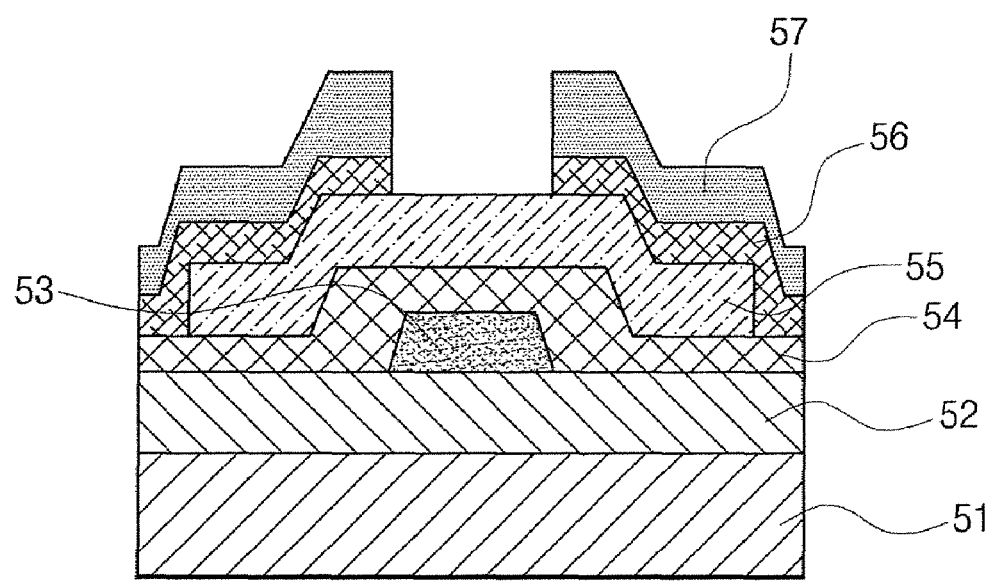
FIG. 5 is a cross-sectional view illustrating a structure of a reverse-staggered polycrystalline silicon thin film transistor wherein a phosphosilicate-spin-on-glass (P-SOG) film is used for a gate insulating film, and a polycrystalline silicon layer is entirely covered with an n+ or p+ ohmic layer.

FIG. 5 is a cross-sectional view illustrating a structure of a reverse-staggered polycrystalline silicon thin film transistor wherein a phosphosilicate-spin-on-glass (P-SOG) film is used for a gate insulating film, and a polycrystalline silicon layer is entirely covered with an n+ or p+ ohmic layer. The structure of the reverse-staggered polycrystalline silicon thin film transistor and a method fabricating the same will be described with reference to FIG. 5.

First, a buffer layer 52 as a P-SOG film is formed on a flexible metal substrate or a glass substrate 51. The formation of the P-SOG film is achieved by spin coating or printing. Then, sputtering and etching processes are performed to form a gate metal film 53 having a thickness of about 100 nm.

A gate insulating film 54 using a P-SOG film is deposited on the gate metal film 53 by spin coating. An amorphous silicon thin film is deposited on the gate insulating film 54 to a thickness of 50 nm. A cap layer is deposited on the amorphous silicon thin film to a thickness of 50 nm. Then, a metal thin film is deposited on the cap layer by using a sputter.

The resulting structure is heated in a furnace to form a polycrystalline silicon layer 55. At this time, the P-SOG film used for the gate insulating film absorbs metal residues left on the amorphous silicon thin film after planarization and crystallization of the gate metal film 53, thereby reducing a metal contamination in the polycrystalline silicon layer 55.

The metal thin film is formed by deposition using ion implantation or plasma chemical vapor deposition (PCVD). The PCVD is carried out by disposing a metal material on the silicon thin film and exposing the metal material to plasma. Alternatively, the metal thin film is formed by spin coating using a liquid metal dissolved in an acid solution, or a mixture of a viscous organic material and a liquid metal An n+ or p+ layer 56 is formed on the polycrystalline silicon layer 55. A source/drain metal 57 is deposited on the n+ or p+ layer 56 by sputtering. The n+ or p+ ohmic layer as shown in FIG. 5 entirely covers the polycrystalline silicon layer 55, in contrast to those as shown in FIGS. 2 to 4.

Figure 6:
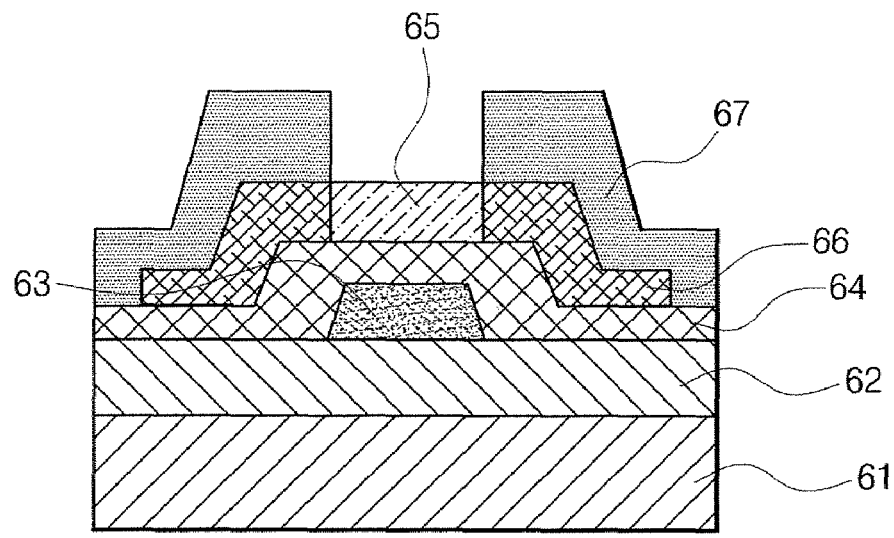
FIG. 6 is a cross-sectional view illustrating a structure of a reverse-staggered polycrystalline silicon thin film transistor wherein a phosphosilicate-spin-on-glass (P-SOG) film is used for the gate insulating film, and an n+ or p+ layer is deposited by ion doping.

FIG. 6 is a cross-sectional view illustrating a structure of a reverse-staggered polycrystalline silicon thin film transistor wherein a phosphosilicate-spin-on-glass (P-SOG) film is used for a gate insulating film, and an n+ or p+ layer is deposited by ion implantation. The structure of the reverse-staggered polycrystalline silicon thin film transistor and a method fabricating the same will be described with reference to FIG. 6.

First, a buffer layer 62 as a P-SOG film is formed on a flexible metal substrate or a glass substrate 61. The formation of the P-SOG film is carried out by spin coating or printing. Then, sputtering and etching processes are performed to form a gate metal film 63 having a thickness of 100 nm. A gate insulating film 64 as a P-SOG film is formed on the gate metal film 63 by spin coating. An amorphous silicon thin film is deposited on the gate insulating film 64 to a thickness of 50 nm. A cap layer is deposited on the amorphous silicon thin film to a thickness of 50 nm. Then, a metal thin film is deposited on the cap layer using a sputter.

The resulting structure is heated in a furnace to form a polycrystalline silicon layer 65. At this time, the P-SOG film used for the gate insulating film absorbs metal residues left on the amorphous silicon thin film after planarization and crystallization of the gate metal film 63, thereby reducing a metal contamination in the polycrystalline silicon layer 65.

The metal thin film is formed by deposition using ion implantation or plasma chemical vapor deposition (PCVD). The PECVD may be carried out by disposing a metal material on the silicon thin film and exposing the metal material to plasma. Alternatively, the metal thin film is formed by spin coating using a liquid metal dissolved in an acid solution, or a mixture of a viscous organic material and a liquid metal.

An n+ or p+ layer 66 is formed on the polycrystalline silicon layer 65 by ion doping. A source/drain metal layer 67 is deposited on the n+ or p+ layer 66 by sputtering. After completion of crystallization, the cap layer and metal thin film are removed by etching. As a result, it is possible to prevent a metal contamination in the polycrystalline silicon thin film by metal-induced crystallization from the amorphous silicon thin film.

The cap layer prevents the metal film from being directly in contact with the amorphous or polycrystalline silicon thin film and to obtain a polycrystalline silicon thin film having a high degree of flatness. The cap layer is made of silicon nitride. Alternatively, the cap layer may be made of silicon oxide or an organic material.

The polycrystalline silicon thin film is formed by heat treatment or laser radiation. The heat treatment is carried out by heating in a furnace at a temperature of 400° C. to 700° C. for a long time. The heat treatment may be carried out by rapid thermal annealing (RTA) at a temperature of 400° C. to 700° C.

Figure 7:
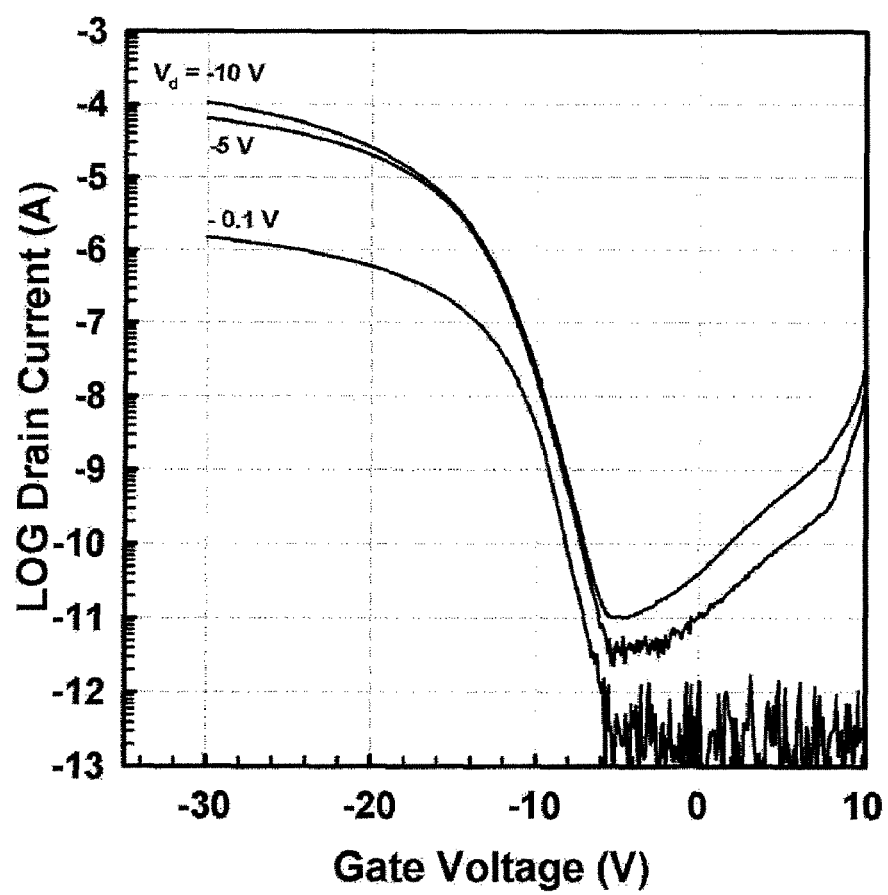
FIG. 7 is a graph illustrating transition characteristics of a reverse-staggered polycrystalline silicon thin film transistor wherein a phosphosilicate-spin-on-glass (P-SOG) film is used for a gate insulating film.

FIG. 7 is a graph illustrating transition characteristics of a reverse-staggered polycrystalline silicon thin film transistor wherein a phosphosilicate-spin-on-glass (P-SOG) film is used for a gate insulating film. As can be seen from FIG. 7, the reverse-staggered polycrystalline silicon thin film transistor has a field-effect mobility of 41 $cm^2/Vs$, a threshold voltage of $-10$ V and a subthreshold slope of 1.0 V.

As apparent from the foregoing, according to the method of the present invention, since the P-SOG film used for the gate insulating film absorbs metal residues left on the polycrystalline silicon thin film, it is possible to reduce a metal contamination in the polycrystalline silicon layer and realize gate planarization. In addition, a polycrystalline silicon thin film having uniform-size grains can be achieved by forming a cap layer on the amorphous silicon. Also, it is possible to fabricate a reverse-staggered polycrystalline silicon thin film transistor having a clean and leveled surface.

Since the cap layer is formed on the amorphous silicon thin film, it can prevent a contamination and oxidation in the surface of the amorphous silicon thin film. Because a formation of metal disilicide in the amorphous silicon thin film can be controlled depending on the nitrogen concentration of the cap layer made of silicon nitride, a superior polycrystalline silicon thin film can be obtained. Since the cap layer is removed before application of the polycrystalline silicon thin film to various devices, it is possible to prevent an undesired metal contamination.

The reverse-staggered polycrystalline silicon thin film transistor of the present invention is utilized to fabricate flat display devices, solar batteries and semiconductor devices.

Although the present invention has been described herein in detail with reference to its preferred embodiments, those skilled in the art will appreciate that these embodiments do not serve to limit the invention and that various changes and modifications may be made thereto without departing from the spirit and scope of the invention as defined in the appended claims.

What is claimed is:

1. A method for fabricating a reverse-staggered polycrystalline silicon thin film transistor comprising the steps of:

forming a buffer layer made of a phosphosilicate-spin-on-glass (P-SOG) on an insulating substrate;

forming a gate metal pattern on the buffer layer;

forming a planarized gate insulating film made of a phosphosilicate-spin-on-glass (P-SOG) on the gate metal pattern;

depositing an amorphous silicon layer on the gate insulating film;

crystallizing the amorphous silicon layer into a polycrystalline silicon layer;

forming a n+ or p+ layer on the polycrystalline silicon layer;

forming a source/drain metal layer on the n+ or p+ layer; and forming a passivation layer on the source/drain metal layer;

wherein the step of crystallizing the amorphous silicon layer into a polycrystalline silicon layer includes the sub-steps:
  forming a cap layer on the amorphous silicon layer;
  depositing a metal film on the cap layer; and
  subjecting the amorphous silicon layer to metal-induced crystallization.

2. A reverse-staggered polycrystalline silicon thin film transistor comprising the steps of:
  forming a buffer layer made of a phosphosilicate-spin-on-glass (P-SOG) on an insulating substrate;
  forming a gate metal pattern on the buffer layer;
  forming a planarized gate insulating film made of a phosphosilicate-spin-on-glass (P-SOG) comprising phosphorus (P) on the gate metal pattern;
  depositing an amorphous silicon layer on the gate insulating film;
  crystallizing the amorphous silicon layer into a polycrystalline silicon layer;
  forming a n+ or p+ layer on the polycrystalline silicon layer;
  forming a source/drain metal layer on the n+ or p+ layer; and
  forming a passivation layer on the source/drain metal layer;
  wherein the step of crystallizing the amorphous silicon layer into a polycrystalline silicon layer includes the sub-steps:
  forming a cap layer on the amorphous silicon layer;
  depositing a metal film on the cap layer; and
  subjecting the amorphous silicon layer to metal-induced crystallization.

3. The method according to claim 1 or 2, wherein the gate metal pattern is made of molybdenum (Mo), molytungsten (MoW) or tungsten (W).

4. The method according to claim 1 or 2, wherein the amorphous silicon layer has a thickness of 20 nm to 1000 nm.

5. The method according to claim 1 or 2, wherein the step of crystallizing the amorphous silicon layer into a polycrystalline silicon layer is carried out by heating.

6. The method according to claim 1 or 2, further comprising the step of pre-heating to form metal disilicide in the amorphous silicon layer, before subjecting the amorphous silicon layer to metal-induced crystallization.

7. The method according to claim 1 or 2, wherein the cap layer is a silicon nitride film or a silicon nitride oxide film.

8. The method according to claim 1 or 2, wherein the amorphous silicon layer is crystallized to disc-shaped grains form polycrystalline silicon.

9. The method according to claim 1 or 2, wherein the metal film on the cap layer has an area density of $10^{12}/cm^2$ to $10^{15}/cm^2$.

10. The method according to claim 1 or 2, wherein the n+ or p+ layer is made of amorphous silicon.

11. The method according to claim 1 or 2, wherein the n+ or p+ layer is made of microcrystalline silicon.

12. The method according to claim 1 or 2, wherein the source/drain metal layer is made of molybdenum (Mo), molytungsten (MoW), chromium (Cr), aluminium (Al) or an alloy thereof.

13. The method according to claim 1 or 2, wherein the gate insulating film has a planarized surface.

14. The method according to claim 1 or 2, the poly-Si after crystallization has grains with polygon structure.

15. The method according to claim 14, the grain size is between 10 and 100 μm.

16. The method according to claim 2, wherein the gate insulating film comprises phosphorus (P) of 5 ppm to 10000 ppm.

17. The method according to claim 1 or 2, the poly-Si has the grain boundaries of straight lines.

18. The method according to claim 1 or 2, the poly-Si has the average Ni concentration between $10^{12}$~$10^{15}$ $cm^{-2}$.

* * * * *